(12) United States Patent
Budd et al.

(10) Patent No.: US 7,980,445 B2
(45) Date of Patent: Jul. 19, 2011

(54) FILL HEAD FOR FULL-FIELD SOLDER COVERAGE WITH A ROTATABLE MEMBER

(75) Inventors: Russell A. Budd, North Salem, NY (US); John P. Karidis, Ossining, NY (US); Mark D. Schultz, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 44 days.

(21) Appl. No.: 12/018,421

(22) Filed: Jan. 23, 2008

(65) Prior Publication Data

US 2009/0183849 A1 Jul. 23, 2009

(51) Int. Cl.
- B23K 1/00 (2006.01)
- B23K 37/06 (2006.01)
- B23K 37/00 (2006.01)
- B23K 35/12 (2006.01)

(52) U.S. Cl. ............ 228/33; 228/39; 228/44.7; 228/245
(58) Field of Classification Search .......... 438/612–614; 118/211, 413, 321, 323
See application file for complete search history.

(56) References Cited

U.S. PATENT DOCUMENTS

| | | | | |
|---|---|---|---|---|
| 3,921,521 A * | 11/1975 | Kudlich | | 101/120 |
| 4,388,863 A * | 6/1983 | De Santis | | 101/129 |
| 4,478,882 A * | 10/1984 | Roberto | | 427/97.7 |
| 4,898,117 A * | 2/1990 | Ledermann et al. | | 118/665 |
| 5,254,362 A * | 10/1993 | Shaffer et al. | | 427/98.4 |
| 5,287,806 A * | 2/1994 | Nanzai | | 101/123 |
| 5,452,655 A * | 9/1995 | Tani | | 101/123 |
| 5,545,465 A * | 8/1996 | Gaynes et al. | | 428/209 |
| 5,925,187 A * | 7/1999 | Freeman et al. | | 118/667 |
| 6,231,333 B1 * | 5/2001 | Gruber et al. | | 425/546 |
| 6,378,762 B1 * | 4/2002 | Takeuchi et al. | | 228/248.1 |
| 6,581,280 B2 * | 6/2003 | Curcio et al. | | 29/832 |
| 6,663,712 B2 * | 12/2003 | Doyle et al. | | 118/301 |
| 6,698,347 B2 * | 3/2004 | Miyahara et al. | | 101/123 |
| 6,708,873 B2 * | 3/2004 | Gruber et al. | | 228/256 |
| 6,725,769 B1 * | 4/2004 | Williams | | 101/123 |
| 6,746,710 B1 * | 6/2004 | Lambert | | 427/96.2 |
| 6,820,544 B2 * | 11/2004 | Miyahara et al. | | 101/123 |
| 6,938,653 B2 * | 9/2005 | Sakaida et al. | | 141/125 |
| 7,096,781 B2 * | 8/2006 | Katano et al. | | 101/123 |
| 7,296,725 B2 * | 11/2007 | Gruber et al. | | 228/8 |
| 7,383,770 B2 * | 6/2008 | Kambara | | 101/123 |
| 7,410,092 B2 * | 8/2008 | Cordes et al. | | 228/256 |
| 7,416,104 B2 * | 8/2008 | Cordes et al. | | 228/103 |
| 7,449,067 B2 * | 11/2008 | Andry et al. | | 118/209 |
| 7,497,366 B2 * | 3/2009 | Chey et al. | | 228/256 |
| 2008/0070011 A1 * | 3/2008 | Oh et al. | | 428/208 |

FOREIGN PATENT DOCUMENTS

JP 2000228410 A * 8/2000
* cited by examiner

*Primary Examiner* — Kiley Stoner
*Assistant Examiner* — Carlos Gamino
(74) *Attorney, Agent, or Firm* — Jose Gutman; Fleit Gibbons Gutman Bongini & Bianco PL

(57) ABSTRACT

A system, apparatus, and method, are provided to deposit conductive bonding material into cavities in a mold. A fill head is placed in substantial contact with a mold that includes cavities. The fill head includes a sealing member that substantially encompasses an entire area to be filled with conductive bonding material. The conductive bonding material is forced out of the fill head toward the mold. The conductive bonding material is provided into at least one cavity of the cavities contemporaneous with the at least one cavity being in proximity to the fill head.

4 Claims, 11 Drawing Sheets

FILL HEAD FOR FULL-FIELD SOLDER COVERAGE WITH A ROTATABLE MEMBER

FIELD OF THE INVENTION

The present invention generally relates to the field of placement of conductive bonding material such as solder on electronic pads, and more particularly relates to fill techniques for injection molding of solder on integrated circuit chip pads.

BACKGROUND OF THE INVENTION

In modern semiconductor devices, the ever increasing device density and decreasing device dimensions demand more stringent requirements in the packaging or interconnecting techniques of such devices. Conventionally, a flip-chip attachment method has been used in the packaging of IC chips. In the flip-chip attachment method, instead of attaching an IC die to a lead frame in a package, an array of solder balls is formed on the surface of the die.

Controlled Collapse Chip Connection New Process ("C4NP") is another method of depositing conducting bonding material onto molds. C4NP is a subset technology of IMS, which is further discussed in U.S. Pat. No. 5,244,143 and is commonly owned by International Business Machines Corporation, and is hereby incorporated by reference in its entirety. C4NP allows the creation of pre-patterned solder balls to be completed while a silicon wafer is still in the front-end of a manufacturing facility, potentially reducing cycle time significantly. The solder bumps can be inspected in advance and deposited onto the silicon wafer in one simple step. In this technology, a solder head with an injection aperture comprising molten solder scans over the surface of the mold. In order to fill the cavities on the mold, pressure is applied onto the reservoir of the C4NP head which comprises the molten solder as it is scanned over the cavities. The filling of the C4NP mold plate in a reliable, high speed and cost-effective manner is a challenge. Current C4NP systems use a scanning fill head which covers only a portion of the total area to be filled at any one time. This approach requires sealing elements, which must contain solder, air, and/or vacuum at significant pressure differentials while the seal is scanned across the mold plate.

Therefore a need exists to overcome the problems with the prior art as discussed above.

SUMMARY OF THE INVENTION

Briefly, in accordance with the present invention, a method for depositing conductive bonding material into a plurality of cavities in a mold is disclosed. The method includes placing a fill head in substantial contact with a mold comprising a plurality of cavities. The fill head includes a sealing member that substantially encompasses an entire area to be filled with conductive bonding material. The conductive bonding material is forced out of the fill head toward the mold. The conductive bonding material is provided into at least one cavity of the plurality of cavities contemporaneous with the at least one cavity being in proximity to the fill head.

In another embodiment, another method for depositing conductive bonding material into a plurality of cavities in a mold is disclosed. The method includes placing a fill head in substantial contact with a mold comprising a plurality of cavities. The fill head comprises a sealing member that substantially encompasses an entire area to be filled with conductive bonding material. The mold is situated on top of the fill head and the fill head is situated so that the sealing member is facing in a upward direction with respect to the plurality of cavities. The fill head and mold are transitioned so that the fill head is situated on top of the mold and so that the plurality of cavities is facing in an upward direction with respect to the sealing member. The conductive bonding material is forced out of the fill head toward the mold. The conductive bonding material is provided into at least one cavity of the plurality of cavities contemporaneous with the at least one cavity being in proximity to the fill head.

An advantage of the foregoing embodiments of the present invention is that conductive bonding material such as solder can be precisely dispensed into the mold plate using a full-field solder fill head that can cover the entire region to be filled. The present invention allows the seal(s) of the fill head to be stationary during the solder fill process steps where the highest pressure differentials occur. The fill head seals only slide over the mold surface during the solder fill process steps where relatively low pressure differentials are required. Stated differently, the present invention does not require a sealing member to withstand large pressure differentials while sliding across a mold plate. Another advantage of various embodiments of the present invention is that air can be evacuated from all cavities so that the cavities can be reliably filled with pressurized solder.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention.

DETAILED DESCRIPTION

As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting; but rather, to provide an understandable description of the invention.

The terms "a" or "an", as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically.

Conventional C4NP Mold Fill Process

Figure 1:
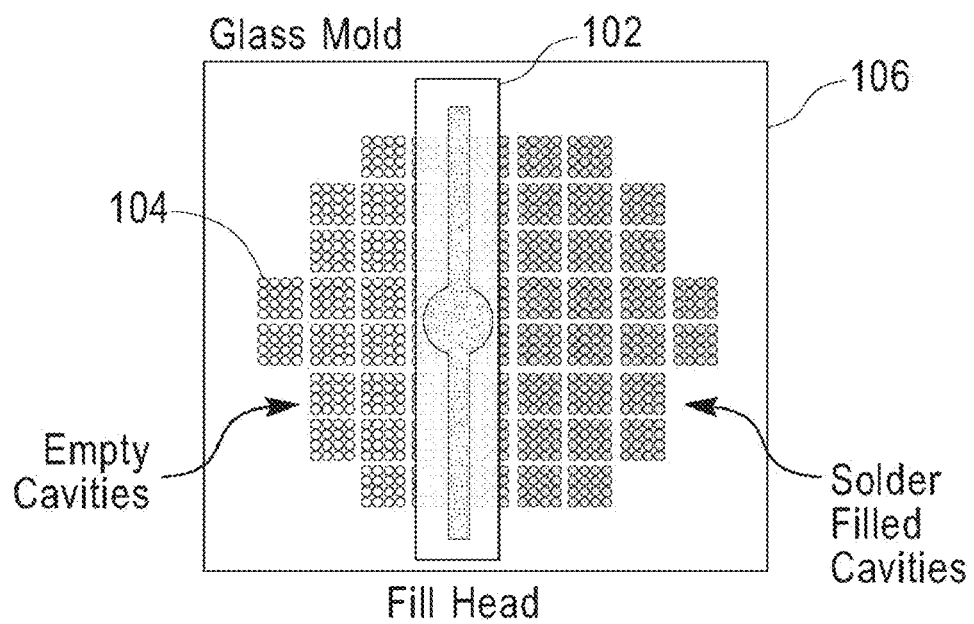
FIG. 1 is a block diagram showing a top view of a conventional C4NP mold fill process.
Figure 2:
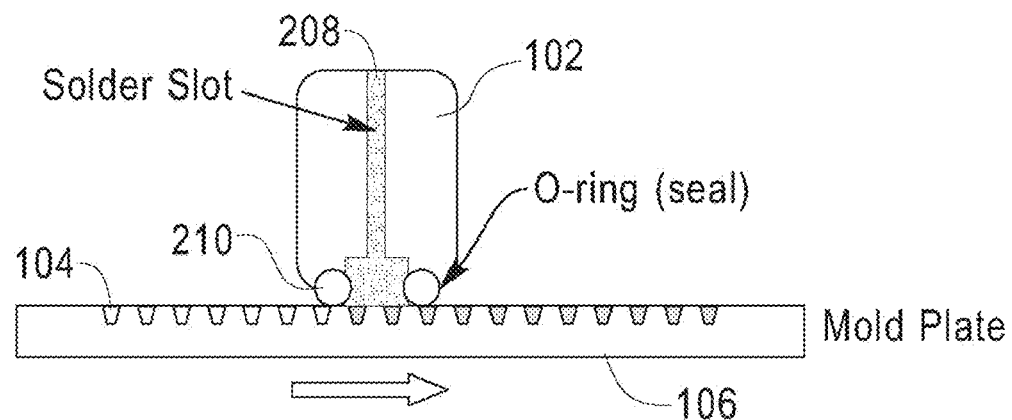
FIG. 2 is a block diagram showing a cross-sectional view of the conventional C4NP mold fill process of FIG. 1.

FIGS. 1-2 illustrate a conventional C4NP mold fill process. In particular FIG. 1 shows an overhead view of a conventional fill head 102 dispensing solder into cavities 104 on a mold plate 106. FIG. 2 shows a cross-sectional view of FIG. 1. The conventional fill head 102 of FIGS. 1-2 dispenses molten solder into the mold plate 106 utilizing a round O-ring seal. In conventional C4NP systems the fill head 102 is heated above the melting point of the solder, for the case of Tin/Copper solder above 230 C. The liquid solder is held in a reservoir 208 inside the fill head 102 and covered by a lid (not shown). The fill head 102 rests on the mold plate 106 and O-ring seal 210 prevents the solder from leaking out the bottom of the fill head 102. The fill process begins by first applying a nominal load or down force on the O-ring seal 210, typically on the order of 2.5 lbs/linear inch. The fill head reservoir 208 is then pressurized, usually to 20 psi, to ensure the solder enters the mold plate cavities 104 during the fill process.

Next, the fill head 102 is moved across the mold plate surface, typically at a speed of between 0.1 to 10 mm/sec. As the fill head moves over the mold plate 106 the air in the cavities 104 is expelled and replaced by liquid solder from the fill head 102. The mold plate 106 with the solder filled cavities 104 is then removed and passed to the next tool for transfer of the solder to a silicon wafer.

A key difficulty of this conventional approach is that the O-ring 210 is sealing against significant solder pressure at the same time that it is being dragged across the mold surface. This requires that a seal material be selected that can withstand high temperatures and solder contact and seal against substantial pressure differential, while also not experiencing mechanical failure or excessive wear as a result of contact with the cavity-filled mold plate 106. Given that the mold plate 106 is often made of glass and the cavities often have relatively sharp edges, it can be quite difficult to find a material that can withstand the "filing action" of the mold-plate under the high compression forces needed to seal against solder leakage.

Full-Field Solder Coverage

Figure 3:
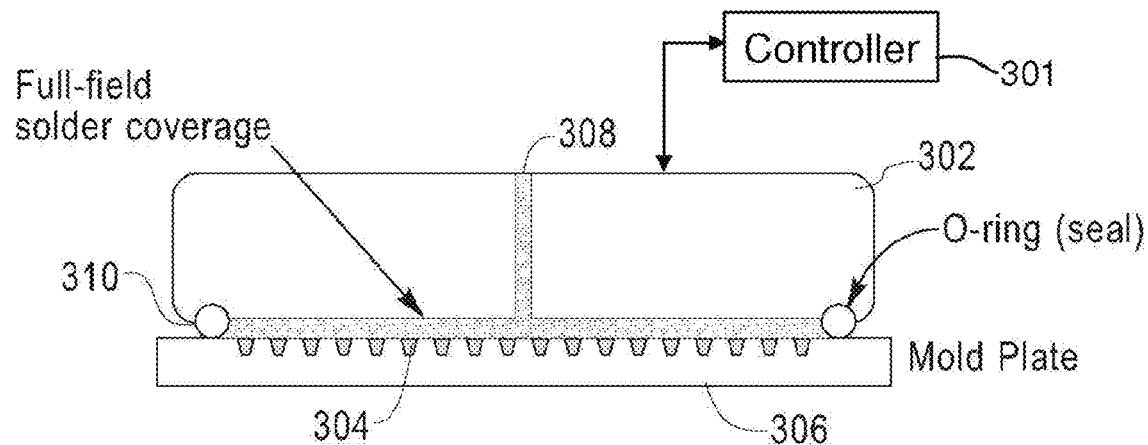
FIG. 3 is a block diagram showing a cross-sectional view of an example of a full-field fill head according to one embodiment of the present invention.
Figure 4:
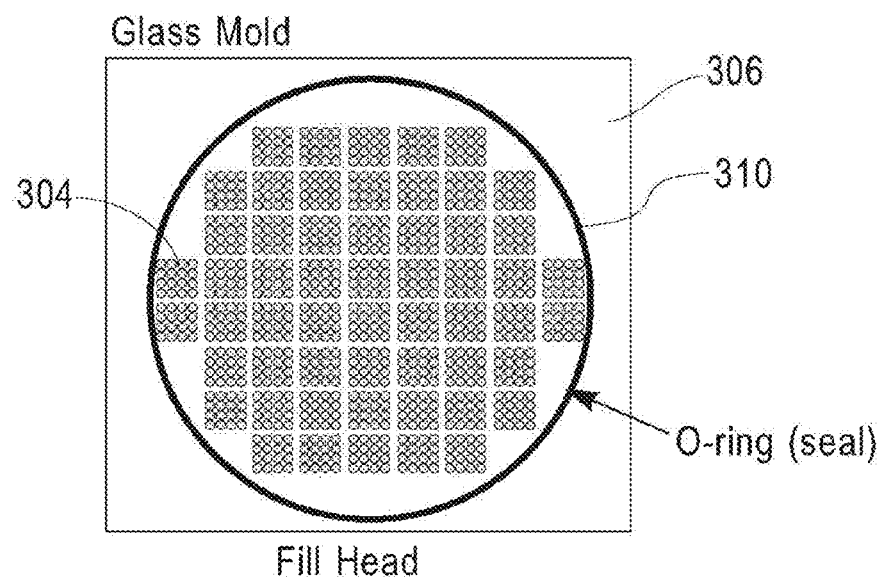
FIG. 4 is a block diagram showing a top view of the full-field fill head of FIG. 3.

According to an embodiment of the present invention, FIGS. 3-13 illustrate systems and methods for C4NP full-field solder coverage according to various embodiments of the present invention. In particular, FIG. 3 shows a cross-sectional view of an example of a full-field fill head 302. FIG. 4 is a top-view of the fill head 302 of FIG. 3. The fill head 302, according to the present example, comprises, a reservoir 308, and an O-ring 310 that substantially surrounds an area of a mold 306 to be filled. The mold in one embodiment can be rectangular, non-rectangular, or any combination of shapes. In one embodiment, the conductive bonding material, such as solder, is forced out of the reservoir 308 and into the cavities 304 using high pressure. The high pressure is applied while the mold 306 is stationary with respect to the fill head 302. This is advantageous because the large normal forces needed to seal against solder leakage are only needed when the seal 310 is stationary and when the seal is located above smooth parts of the mold 306. After the solder is forced into the cavities 304 at high pressure, the pressure can be reduced while the mold 306 is translated out from underneath the fill head 302. Since the sliding occurs only when the solder pressure is low, the normal force applied to the seal 310 can be low thereby reducing friction and wear occurring at the seal 310.

Figure 5:
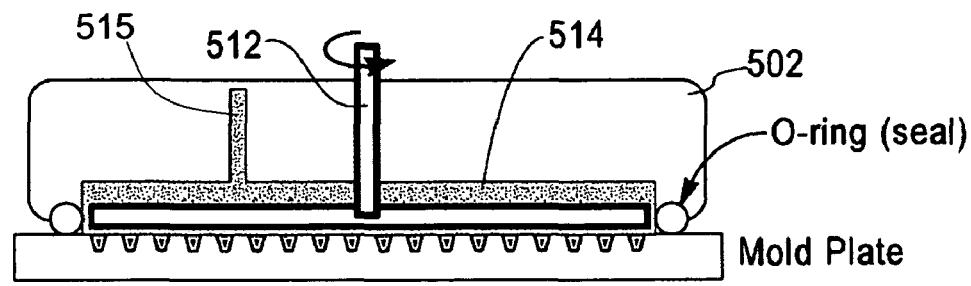
FIG. 5 is a block diagram showing a cross-sectional view of another example of a full-field fill head according to one embodiment of the present invention.
Figure 6:
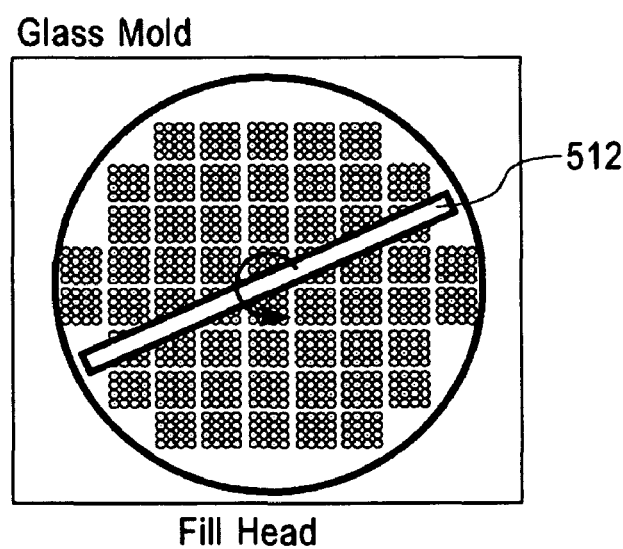
FIG. 6 is block diagram showing a top view of the full-field fill head of FIG. 5.

FIG. 5 shows a cross-sectional view of another example of a full-field fill head 502. FIG. 6 illustrates a top-view of the fill head 502 shown in FIG. 5. The fill head 502 includes a rotating and/or agitating blade 512 inside the molten solder pool 514 and further including channel 515. This blade 512 can be rotated and/or agitated vigorously during various steps of the solder filling process to improve the fill performance, which is discussed in greater detail below.

Figure 7:
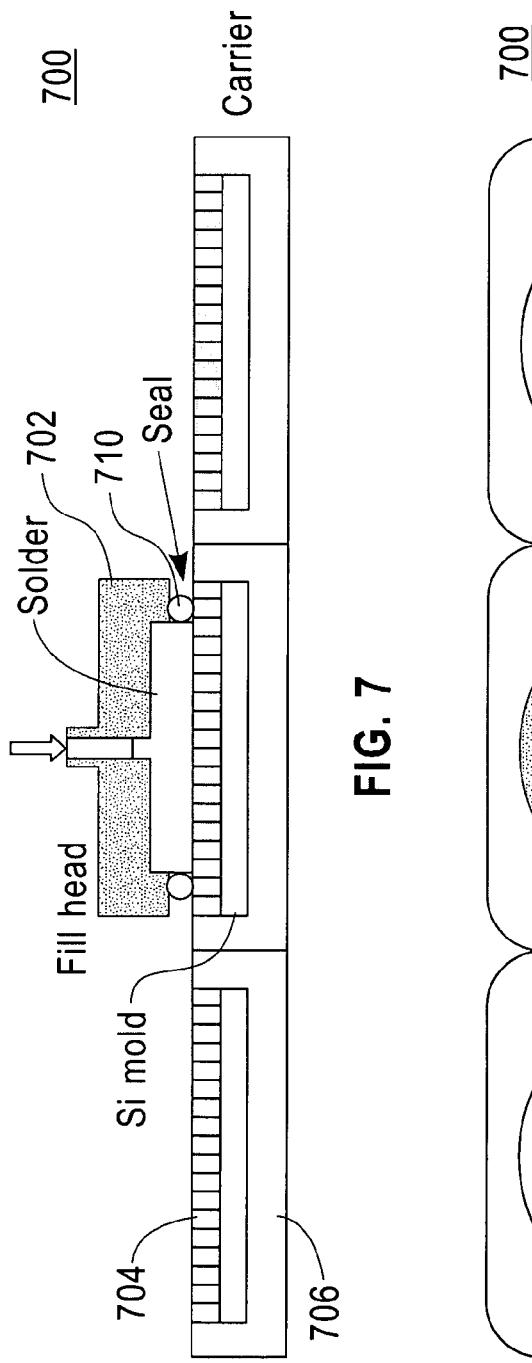
FIG. 7 is a block diagram showing a cross-sectional view of a full-field coverage system according to one embodiment of the present invention.
Figure 8:
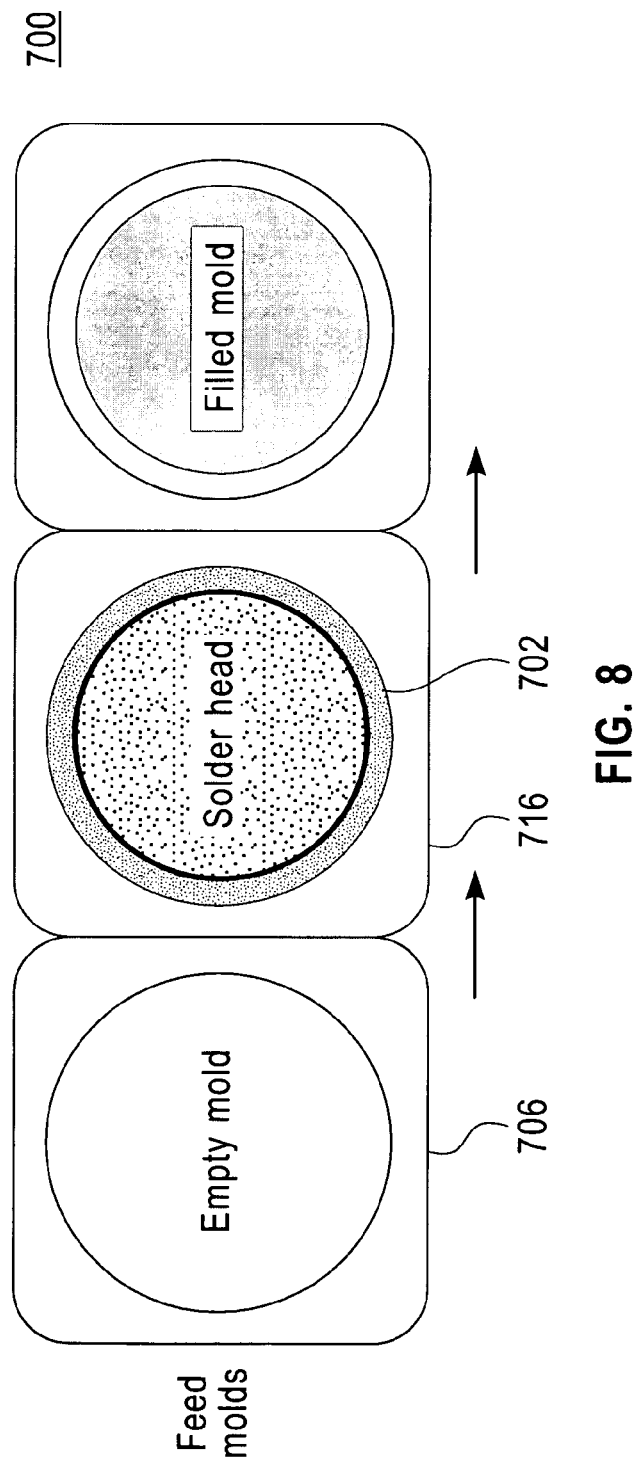
FIG. 8 is a block diagram showing a top view of the full-field coverage system of FIG. 7.

FIGS. 7-8 illustrate one embodiment of depositing a conductive bonding material into cavities in a mold using a full-field coverage process. FIG. 7 shows a cross-sectional view of a full-field coverage system 700 where a fill head 702 deposits solder into cavities 704 on a mold 706. FIG. 8 shows a top-view of the full-field coverage system 700 of FIG. 7. FIGS. 7-8 show a succession of the mold 706 during the solder filling process. For example, FIGS. 7-8 show the mold 706 as empty, being filled with solder, and filled with solder. As discussed above the full-field fill head 702 includes an O-ring seal 710 that substantially covers an area on the mold 706 that is to be filled with solder.

In one embodiment, unfilled mold 706 is placed in position next to the full-field solder fill head 702. The unfilled mold 706 is slid underneath the fill head 702 while the solder is being held near ambient pressure. The seal 710 is held in contact with the mold 706 with just enough force to prevent/minimize any solder leakage during the motion. A region above the solder is filled with high-pressure gas such as nitrogen to force the solder into the mold cavities 704.

Once the solder has been forced into the cavities 704 and contacts the cavity walls, the gas pressure above the solder can generally be reduced without affecting the solder-filled cavities 704. The mold 706 is moved out from under the fill head 702 while the solder is held at a relatively low positive pressure with respect to the ambient environment. The wiping action of the seal 710 during this motion acts to squeegee the solder off of the mold surface, leaving only the solder which is in the mold cavities 704.

Figure 9:
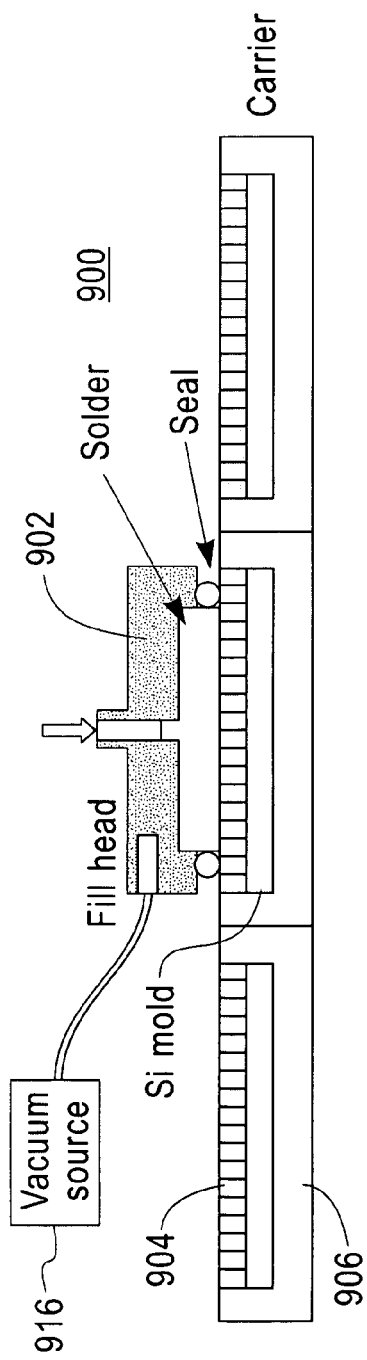
FIG. 9 is a block diagram showing a cross-sectional view of another full-field coverage system according to one embodiment of the present invention.
Figure 10:
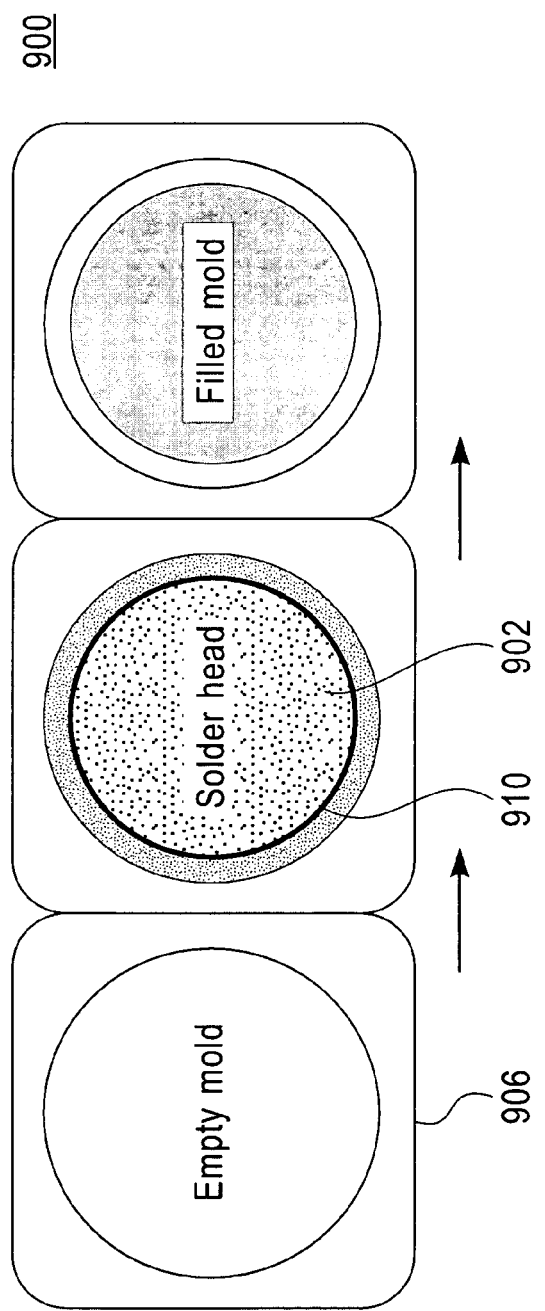
FIG. 10 is a block diagram showing a top view of the full-field coverage system of FIG. 9.

FIGS. 9-10 illustrate another embodiment of depositing a conductive bonding material into cavities in a mold using a full-field coverage process. FIG. 9 shows a cross-sectional view of a full-field coverage system 900 where a fill head 702 deposits solder into cavities 704 on a mold 706 under a vacuum. The system 900 of FIG. 9 removes substantially all of the air from the cavities 904 of the mold 906 by drawing a vacuum above the molten solder before the space above the solder is pressurized to force the solder into the cavities 904. FIG. 10 shows a top-view of the full-field coverage system 900 of FIG. 9. FIGS. 9-10 show a succession of the mold 906 during the solder filling process. For example, FIGS. 9-10 show the mold 906 as empty, being filled with solder, and filled with solder. An unfilled mold 906 is placed in position next to the full-field solder fill head 902.

In one embodiment, an unfilled mold 906 is slid underneath the fill head 902 while the solder is being held near ambient pressure. The seal 910 is held in contact with the mold 906 with just enough force to prevent/minimize any solder leakage during the motion. The region above the solder is evacuated, thereby causing most of the gas trapped in the cavities 904 to bubble up through the solder where it is carried away by the vacuum source 916. The region above the solder is then filled with high-pressure gas such as nitrogen to force the solder into the mold cavities 904. Since most of the gas in the cavities 904 was removed in the previous step, the pressurized solder is more likely to completely fill the cavities as desired.

Once the solder has been forced into the cavities 904 and it makes contact with the cavity walls, the gas pressure above the solder can generally be reduced without affecting the solder-filled cavities. The mold 906 is moved out from under the fill head 902 while the solder is held at a relatively low positive pressure with respect to the ambient environment. The wiping action of the seal 910 during this motion acts to squeegee the solder off of the mold surface, thereby leaving only the solder which is in the mold cavities 904.

Figure 11:
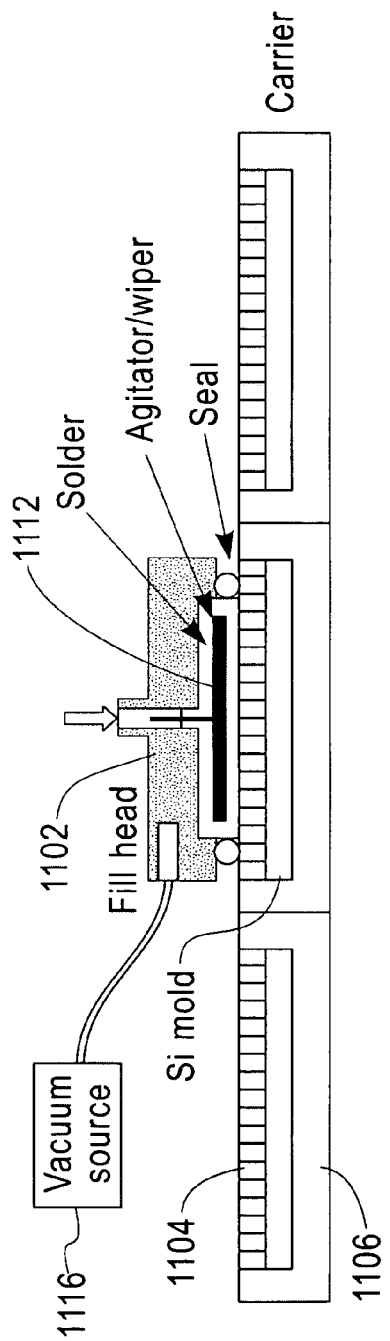
FIG. 11 is a block diagram showing a cross-sectional view of yet another full-field coverage system according to one embodiment of the present invention.
Figure 12:
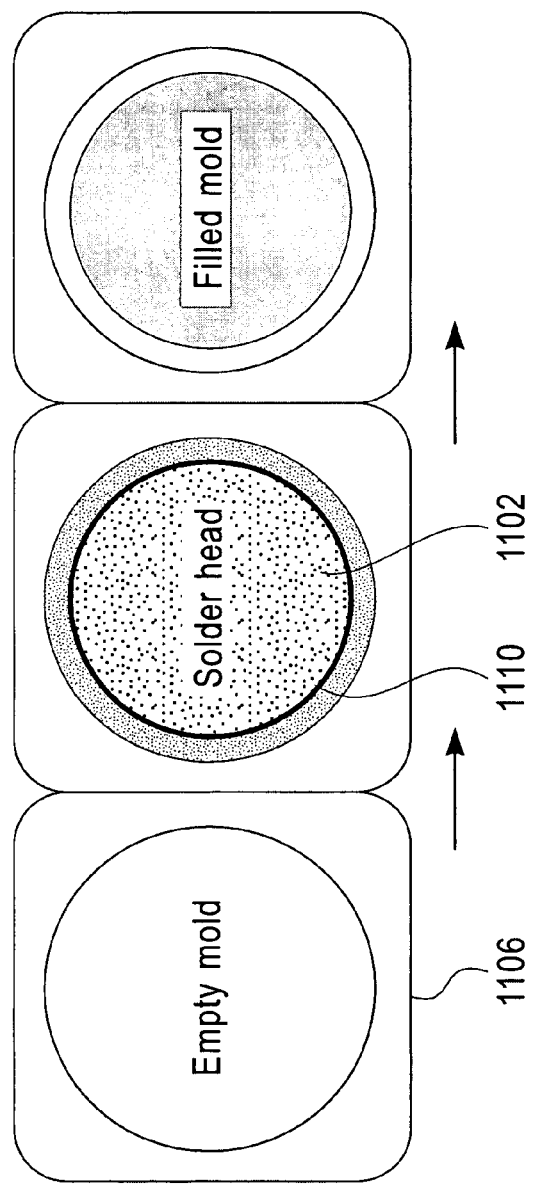
FIG. 12 is a block diagram showing a top view of the full-field coverage system of FIG. 11.

FIGS. 11-12 illustrate another embodiment of depositing a conductive bonding material into cavities in a mold using a full-field coverage process. FIG. 11 shows a cross-sectional view of a full-field coverage system 900 where a fill head 1102 deposits solder into cavities 1104 on a mold 1106 utilizing an agitator bar 1112. FIG. 12 shows a top-view of the full-field coverage system 1100 of FIG. 11. FIGS. 11-12 show a succession of the mold 1106 during the solder filling process. The agitator bar 1112 is used to help dislodge gas bubbles during (and after) the evacuation process stage discussed above. Without agitation, some of the gas trapped in the cavities 1104 can adhere to the mold as small bubbles, even when a vacuum is drawn above the solder, as discussed above. By vigorously stirring the molten solder during this phase, the heavy liquid solder can be used to dislodge such gas bubbles adhering to the mold 1106. Thus, the combination of vacuum above the solder plus vigorous mechanical agitation can substantially improve the probability that essentially all gas is removed from all cavities 1104 in the mold 1106.

In one embodiment, an unfilled mold 1106 is placed in position next to the full-field solder fill head 1102. The unfilled mold 1106 is slid underneath the fill head 1102 while the solder is being held near ambient pressure. The seal 1110 is held in contact with the mold 1106 with just enough force to prevent/minimize any solder leakage during the motion. The region above the solder is evacuated, thereby causing most of the gas trapped in the cavities 1104 to bubble up through the solder, where it is carried away by the vacuum source 1116

The molten solder is vigorously stirred and/or agitated by the agitator bar 1112 to dislodge any gas bubbles which remain adhered to the mold surface. Any dislodged bubbles then rise to the surface of the solder where they are removed by the vacuum source 1116. The region above the solder is then filled with high-pressure gas such as nitrogen to force the solder into the mold cavities 1114. Since most of the gas in the cavities 1114 was removed in the previous step, the pressurized solder is more likely to completely fill the cavities as desired. Once the solder has been forced into the cavities 1114 and makes contact with the cavity walls, the gas pressure above the solder can generally be reduced without affecting the solder-filled cavities 1114. The mold 1106 is moved out from under the fill head 1102 while the solder is held at a relatively low positive pressure with respect to the ambient environment. The wiping action of the seal 1110 during this motion acts to squeegee the solder off of the mold surface, leaving only the solder which is in the mold cavities 1104

Figure 13:
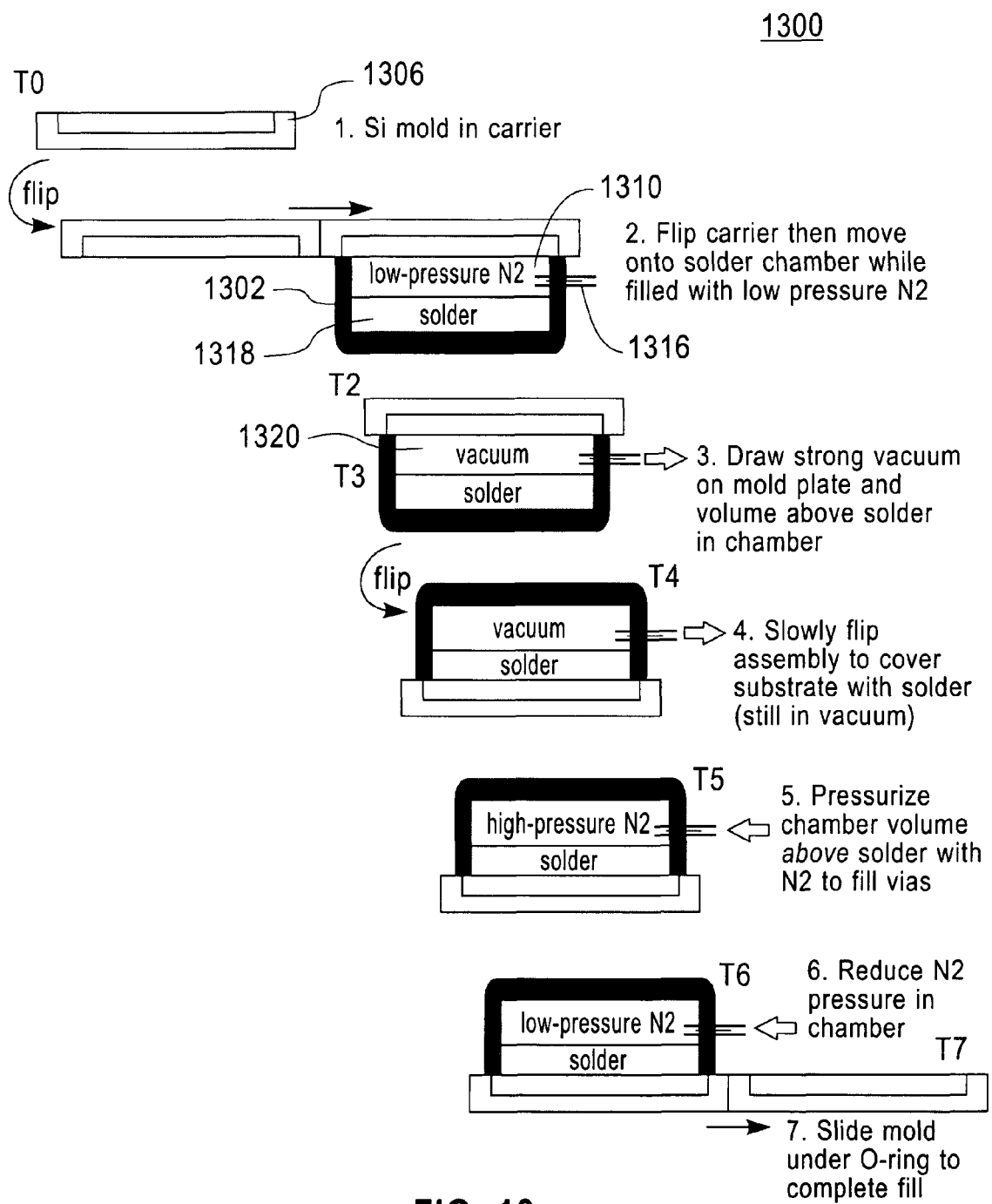
FIG. 13 is a block diagram illustrating a sequence of steps for depositing conductive bonding material into cavities on a mold according to one embodiment of the present invention.

FIG. 13 is a block diagram illustrating a sequence of steps for ensuring that substantially all gas is removed from cavities 1304 in a mold 1306 being filled with solder 1318. In this embodiment, substantially the entire fill head 1302 plus the mold plate 1306 is mounted as one assembly in such a way that it can be rotated between a first position and second position. A rotational mounting arrangement is mechanically coupled with the fill head for rotating the fill head and the mold as one mounted assembly. The rotational mounting arrangement can include one or more mechanical and electrical components that can hold the fill head and the mold as one assembly and can rotate the fill head and the mold between the first and second positions. When the fill head and the mold are together as one assembly, a volume is defined in the fill head between an inner surface of the fill head and a surface area of the mold including a plurality of cavities to be filled. In the first position the mold 1306 is below the fill head 1302 and gravity forces the solder 1318 in contact with the mold 1306 (as discussed above). A second position is utilized where the mold 1306 is substantially at a top portion of the volume and above the fill head 1302 so that gravity holds the solder away from the mold plate 1306. By providing a system 1300 whereby gravity holds the liquid solder away from the mold surface it is possible to evacuate (e.g., via a gas exchange port in the fill head) the cavities 1304 directly without requiring any gases to bubble up through the solder 1318.

In this embodiment, the cavities 1304 can be fully and completely evacuated while the solder is below the mold 1306. After the cavities 1304 (and the rest of the free volume inside the fill head 1302) have been evacuated substantially the entire assembly is slowly flipped over so that the solder flows across the mold surface and pools above the mold 1306. At this point, the solder 1318 might not perfectly wet the entire cavity surface (because of surface tension effects, etc.), and any gas trapped in the cavities 1304 can cause defects. Therefore, application (e.g., via a gas exchange port in the fill head) of pressurized gas above the molten solder can now reliably force the solder completely into all cavities 1304.

In one embodiment, an unfilled mold 1306, at times $T_0$ and $T_1$, is transitioned from a face-up position to a face-down position next to the full-field solder fill head 1302. The full-field solder fill head 1302 is orientated so that the seal 1310 is upward and the solder 1318 is pooled at the bottom of the head 1302, away from the seal 1310. At time $T_2$, the unfilled mold 1306 is slid across (above) the fill head 1302 while gravity holds the solder 1318 away from the seal 1310 and mold plate 1306. The gas above the solder 1318 such as nitrogen is held near the ambient pressure. The seal 1310 is held in contact with the mold 1306 with just enough force to prevent/minimize any solder leakage during the motion. The region 1320 above the solder, at time $T_3$, is evacuated, thereby directly removing any gas that was in the mold cavities 1306 as well as any gas above the solder 1318 or mixed into the solder 1318. All gas in the cavities is directly carried away by the vacuum source.

The entire assembly comprising the fill head 1302, seal 1310, and mold plate 1306 are then slowly rotated 180 degrees at time $T_4$ (i.e., flipped over). This brings the mold plate 1306 underneath (substantially below) the fill head 1302, thereby allowing gravity to force the liquid solder to pool over the entire surface of the mold 1306 as compared to the inside of the seal 1310. The region 1320 above the solder 1318, at time $T_5$, is then filled with high-pressure gas such as nitrogen to force the solder 1318 into the previously evacuated cavities 1304. Since essentially all of the gas in the cavities 1304 was removed in the previous step, the pressurized solder is virtually guaranteed to completely fill all of the cavities 1304 as desired.

Once the solder 1318 has been forced into the cavities 1304 and it makes contact with the cavity walls, the gas pressure above the solder 1318, at time $T_6$, can generally be reduced without affecting the solder-filled cavities. The mold 1306, at time $T_7$, is moved out from under the fill head 1302 while the solder 1318 is held at a relatively low positive pressure with respect to the ambient environment. The wiping action of the seal 1310 during this motion acts to squeegee the solder 1318 off of the mold surface, thereby leaving only the solder 1318 which is in the mold cavities 1304.

As can be seen from the above discussion the various examples of the present invention are advantageous in that they improve the reliability of the mold plate fill process by using a fill head and related processes that do not require a sealing member to withstand large pressure differentials while sliding across the mold plate. The sealing element, according to various embodiments of the present invention, only has to withstand high pressure differential while stationary, and only has to withstand sliding motion while sealing against small pressure differentials. The solder fill head, according to certain examples, can be at least as large as the full mold pattern to be filled. The fill head is scanned onto a mold plate while the solder is kept near ambient pressure. A vacuum is then drawn above the pooled solder (which covers the entire mold area) in order to draw any trapped air away from the mold surface. After the air has been evacuated, the space above the pooled solder is highly pressurized with inert gas to force the solder into the cavities.

The fill head is scanned off of the mold plate while the solder pressure is held at a relatively low pressure differential with respect to ambient. Note that in this process, the seal was stationary during high-pressure-differential operations such as vacuum evacuation and pressurized solder fill, and the seal was only sliding during low-pressure-differential operations such as mold loading and final solder wiping. This approach thus allows the use of high seal loading forces during high-pressure operations which occur while stationary, and low seal loading forces during sliding motion, thereby greatly reducing seal wear and increasing the range of seal materials which can be used.

Various embodiments of the present invention, as discussed above, also utilize a rotating or oscillating agitator blade to improve the vacuum evacuation of the cavities by aggressively stirring the molten solder so as to dislodge any gas bubbles adhering to the mold cavities. Another advantage is that the entire mold plate plus solder fill head assembly can be flipped over during the process, thereby allowing some process steps (especially vacuum evacuation) to occur with the liquid solder supply below and not in contact with the mold surface. Other process steps (especially pressurized solder filling of the cavities) can occur with the liquid solder above and in contact with the mold surface.

Process of Filling a Non-Rectangular Mold with Solder

Figure 14:
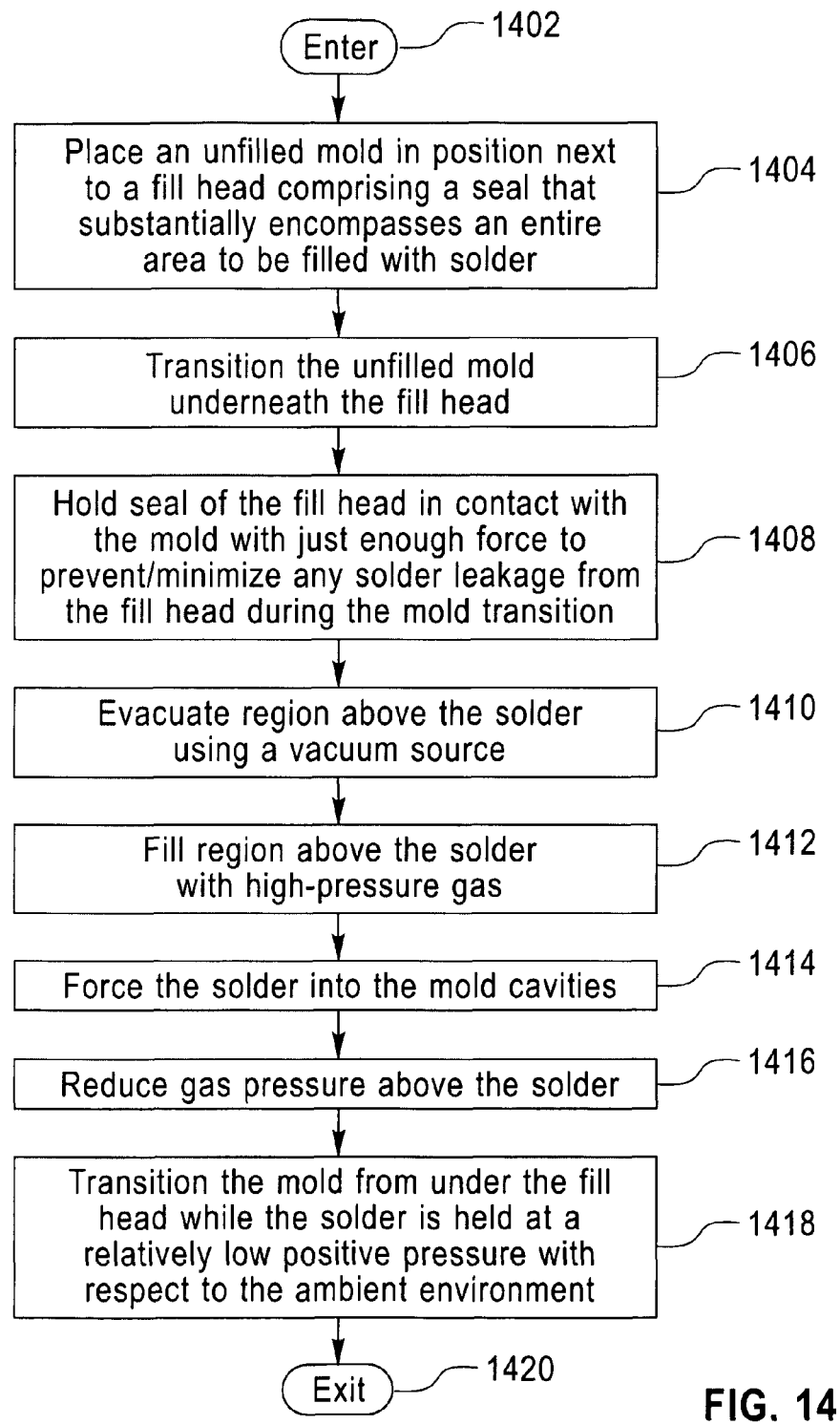
FIG. 14 is an operational flow diagram illustrating an example of a process of filling molds using a full-field coverage system according to one embodiment of the present invention.

FIG. 14 is an operational flow diagram illustrating an example of a process of filling molds using a full-field coverage system. The operational flow diagram of FIG. 14 begins at step 1402 and flows directly to step 1404. An unfilled mold 906, at step 1404, is placed in position next to the full-field solder fill head 902. The unfilled mold 906, at step 1406, is transitioned underneath the fill head 902. This occurs while the solder within the fill head 902 is being held near ambient pressure. The seal 910, at step 1408, is held in contact with the mold 906 with just enough force to prevent/minimize any solder leakage during the motion.

A region above the solder, at step 1410, is evacuated, causing most of the gas trapped in the cavities to bubble up through the solder, where it is carried away by the vacuum source 916. The region above the solder, at step 1412, is then filled with high-pressure gas such as nitrogen. The solder, at step 1414, is then forced into the mold cavities 904. Since most of the gas in the cavities 904 was removed in the previous step, the pressurized solder is more likely to completely fill the cavities 904 as desired. The gas pressure, at step 1416, above the solder is reduced without affecting the solder-filled cavities 904. The mold 906, at step 1418, is transitioned from under the fill head 902 while the solder is held at a relatively low positive pressure with respect to the ambient environment. The wiping action of the seal during this motion acts to squeegee the solder off of the mold surface, leaving only the solder which is in the mold cavities 904. The control flow then exits at step 1420.

Another Process of Filling a Non-Rectangular Mold with Solder

Figure 15:
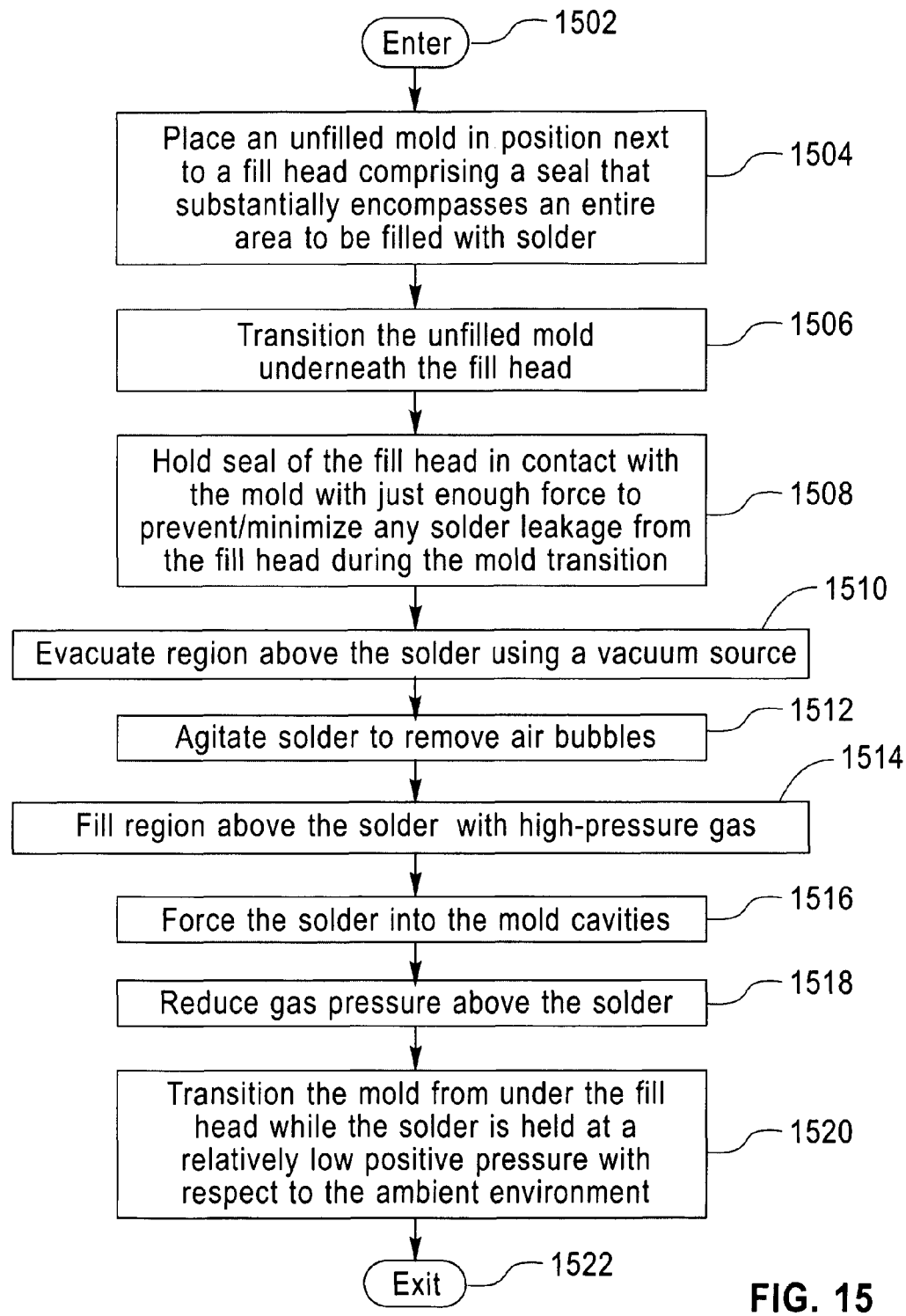
FIG. 15 is an operational flow diagram illustrating another example of a process of filling molds using a full-field coverage system according to one embodiment of the present invention.

FIG. 15 is an operational flow diagram illustrating another example of a process of filling molds using a full-field coverage system. The operational flow diagram of FIG. 15 begins at step 1502 and flows directly to step 1504. An unfilled mold 1106, at step 1504, is placed in position next to the full-field solder fill head 1102. The unfilled mold 1106, at step 1506, is transitioned underneath the fill head 1102. This occurs while the solder within the fill head 1102 is being held near ambient pressure. The seal 1110, at step 1508, is held in contact with the mold 1106 with just enough force to prevent/minimize any solder leakage during the motion.

A region above the solder, at step 1510, is evacuated, causing most of the gas trapped in the cavities to bubble up through the solder, where it is carried away by the vacuum source 1116. The solder within the fill head 1102, at step 1512, is vigorously stirred and/or agitated to dislodge any gas bubbles which remain adhered to the mold surface. Any dislodged bubbles then rise to the surface of the solder where they are removed by the vacuum source 1116. The region above the solder, at step 1514, is then filled with high-pressure gas such as nitrogen. The solder, at step 1516, is then forced into the mold cavities 1104. Since most of the gas in the cavities 1104 was removed in the previous step, the pressurized solder is more likely to completely fill the cavities 1104 as desired. The gas pressure, at step 1518, above the solder is reduced without affecting the solder-filled cavities 1104. The mold 1106, at step 1520, is transitioned from under the fill head 1102 while the solder is held at a relatively low positive pressure with respect to the ambient environment. The wiping action of the seal during this motion acts to squeegee the solder off of the mold surface, leaving only the solder which is in the mold cavities 1104. The control flow then exits at step 1522.

Another Process of Filling a Non-Rectangular Mold with Solder

Figure 16:
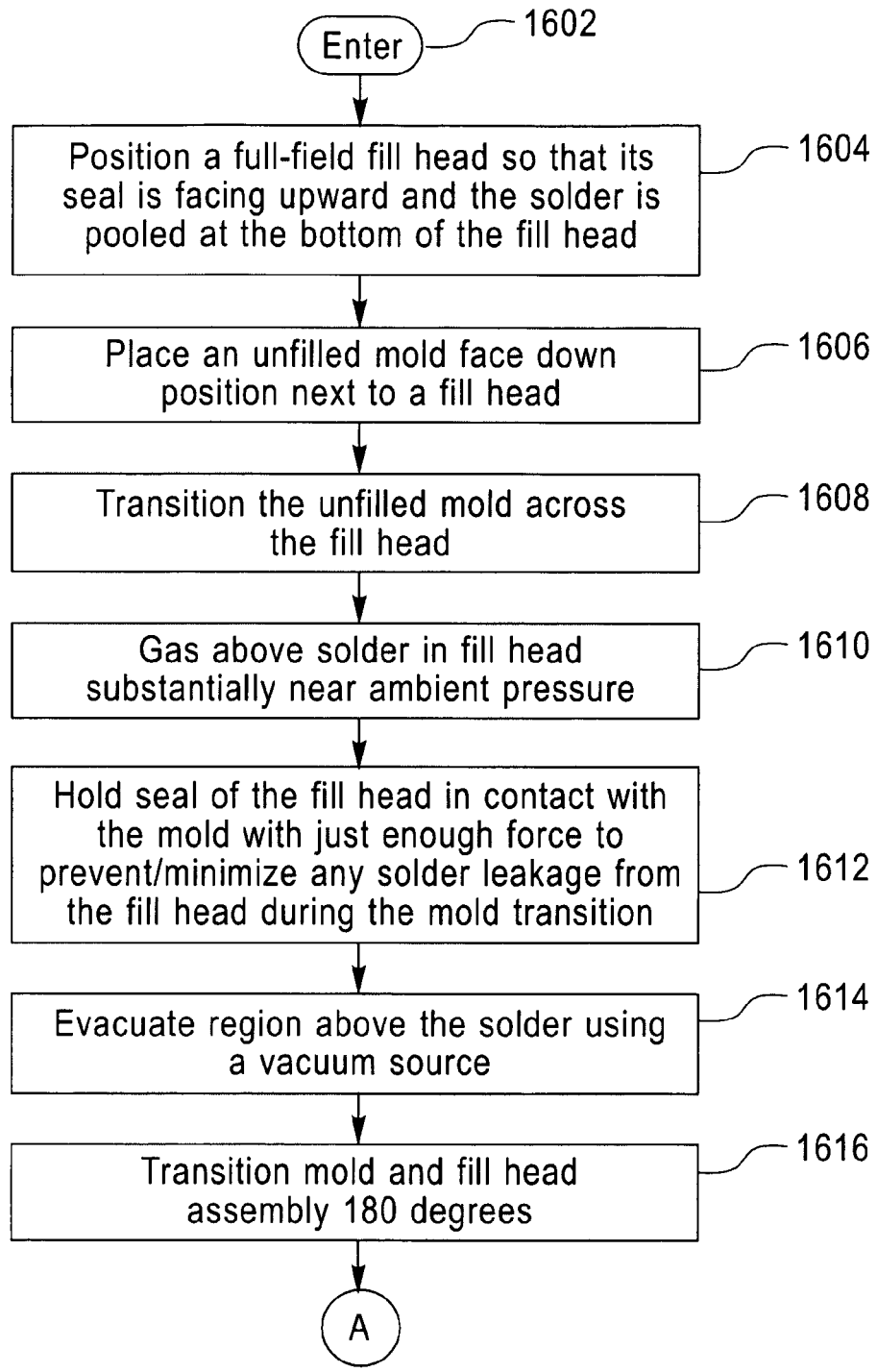
FIG. 16 is an operational flow diagram illustrating yet another example of a process of filling molds using a full-field coverage system according to one embodiment of the present invention.
Figure 17:
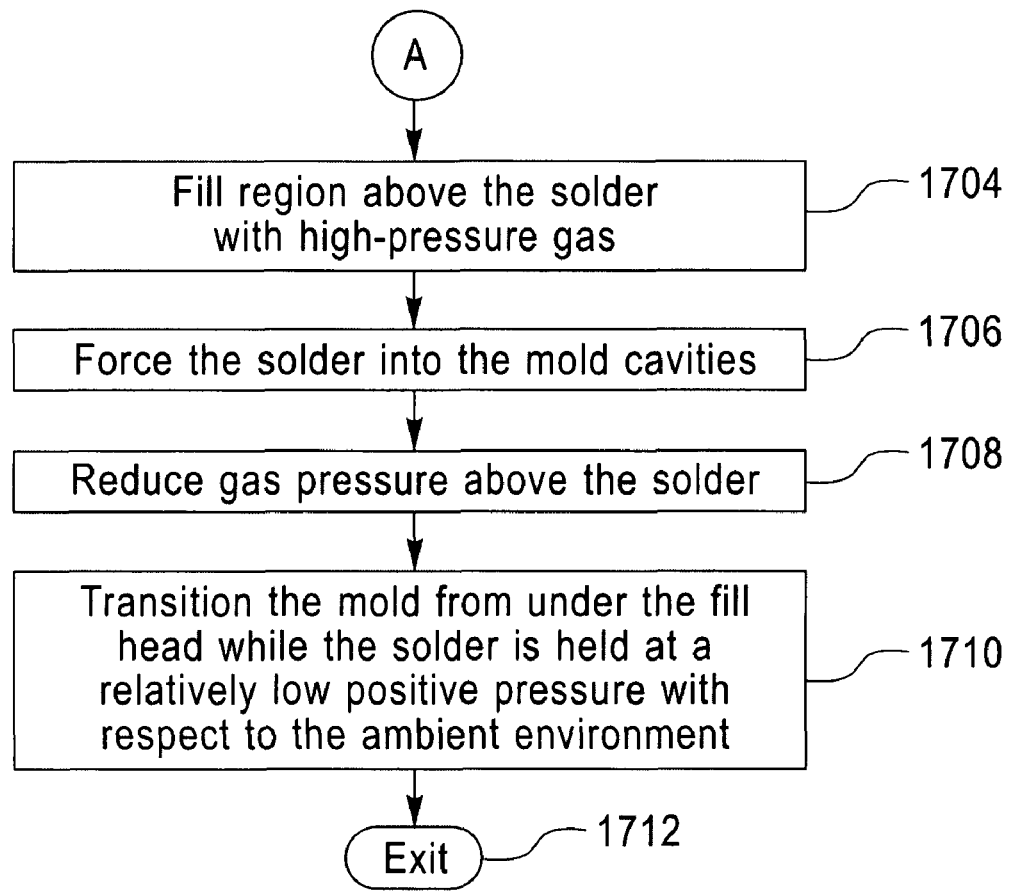
FIG. 17 is an operational flow diagram continuing the process of FIG. 16.

FIGS. 16-17 are operational flow diagrams illustrating another example of a process of filling molds using a full-field coverage system. The operational flow diagram of FIG. 16 begins at step 1602 and flows directly to step 1604. A full-field fill head 1302, at step 1604, is positioned so that the seal 1310 is upward and the solder 1318 is pooled at the bottom of the fill head 1302 away from the seal. An unfilled mold 1306, at step 1606, is placed in position next to the full-field solder fill head 1302. The unfilled mold 1306, at step 1608, is transitioned across the fill head 1302. Gravity holds the solder 1318 away from the seal and mold 1306. The gas above the solder 1318 in the fill head 1302, at step 1610, is held substantially near ambient pressure. The seal 1310, at step 1612, is held in contact with the mold 1306 with just enough force to prevent/minimize any solder 1318 leakage during the motion.

A region above the solder 1318, at step 1614, is evacuated, causing most of the gas trapped in the cavities to bubble up through the solder 1318, where it is carried away by the vacuum source 1316. The fill head 1302 and mold 1306, at step 1616, are transitioned 180 degrees so that the mold 1306 is underneath the fill head, thereby allowing gravity to force the liquid solder 1318 to pool over the entire surface of the mold 1306 (inside the seal 1310). The control flows to entry point A of FIG. 17. The region above the solder 1318, at step 1704, is then filled with high-pressure gas such as nitrogen. The solder 1318, at step 1706, is then forced into the mold cavities 1304. Since most of the gas in the cavities 1304 was removed in the previous step, the pressurized solder 1318 is more likely to completely fill the cavities 1304 as desired. The gas pressure, at step 1708, above the solder 1318 is reduced without affecting the solder-filled cavities 1304. The mold 1306, at step 1710, is transitioned from under the fill head 1302 while the solder 1318 is held at a relatively low positive pressure with respect to the ambient environment. The wiping action of the seal during this motion acts to squeegee the solder 1318 off of the mold surface, leaving only the solder 1318, which is in the mold cavities 1304. The control flow then exits at step 1712.

Non-Limiting Examples

The foregoing embodiments of the present invention are advantageous because they provide a technique for filling non-rectangular molds or substrates with a conductive bonding material using an IMS system. The discussed examples of the present invention allow for molds that more closely resemble their associated non-rectangular silicon wafer to be used. Furthermore, the fill heads provide a means for heating throughout the heads that melt material to be deposited into cavities of a mold and cooling gasses that solidify the material within the cavities.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

What is claimed is:

1. A fill head for depositing conductive bonding material onto a mold comprising a plurality of conductive bonding material receiving cavities, the fill head comprising:
   a cavity defined within a bottom surface and extending towards a top surface;
   a channel extending into the cavity for delivering conductive bonding material into the cavity;
   a sealing member circumscribing the cavity, the sealing member abutting at least a portion of the bottom surface and extending below the bottom surface;
   a rotatable member disposed within the cavity, wherein the rotatable member comprises a rotatable shaft with an axis perpendicular to the bottom surface, and wherein the rotatable member is configured to rotate along the axis.

2. The fill head of claim 1, further comprising
   a vacuum source, gas evacuation coupled to a region in the fill head above and including an area surrounded by the sealing member of the fill head.

3. The fill head of claim 1, wherein the sealing member is substantially circular.

4. The fill head of claim 1, wherein the sealing member is an O-ring.

* * * * *